(12) United States Patent
Tsai

(10) Patent No.: US 9,214,820 B2
(45) Date of Patent: Dec. 15, 2015

(54) BATTERY SYSTEM BALANCING CONTROL METHOD FOR PERFORMING BALANCING CONTROL WITH AID OF REFERENCE VOLTAGE INFORMATION AND BATTERY SYSTEM THEREOF

(71) Applicant: Fu-Sheng Tsai, Taoyuan County (TW)

(72) Inventor: Fu-Sheng Tsai, Taoyuan County (TW)

(73) Assignee: Fu-Sheng Tsai, Taoyuan Dist., Taoyuan (TW)

( * ) Notice: Subject to any disclaimer, the term of this patent is extended or adjusted under 35 U.S.C. 154(b) by 163 days.

(21) Appl. No.: 14/191,452

(22) Filed: Feb. 27, 2014

(65) Prior Publication Data

US 2014/0239899 A1 Aug. 28, 2014

Related U.S. Application Data

(60) Provisional application No. 61/769,754, filed on Feb. 27, 2013.

(51) Int. Cl.
*H02J 7/00* (2006.01)
*H03K 5/04* (2006.01)

(52) U.S. Cl.
CPC .............. *H02J 7/0014* (2013.01); *H02J 7/007* (2013.01); *H03K 5/04* (2013.01); *Y10T 307/747* (2015.04)

(58) Field of Classification Search
CPC .. H02J 7/0016; H02J 7/0018; Y02T 10/7055; Y02E 60/12; H01M 10/441
USPC ......................................................... 320/118
See application file for complete search history.

(56) References Cited

U.S. PATENT DOCUMENTS

| | | | | |
|---|---|---|---|---|
| 6,437,539 B2* | 8/2002 | Olsson | .......................... | 320/118 |
| 7,999,554 B2* | 8/2011 | Bucur | ................. | H01M 2/1016 320/112 |
| 8,054,034 B2* | 11/2011 | Lim | ...................... | H02J 7/0016 320/101 |
| 2006/0103349 A1* | 5/2006 | Yamamoto | .......... | H01M 2/1022 320/116 |
| 2006/0194102 A1* | 8/2006 | Keshishian | ........... | H01M 2/202 429/160 |
| 2011/0254502 A1* | 10/2011 | Yount | ................... | B60L 3/0046 320/107 |
| 2012/0139547 A1* | 6/2012 | Chen | .................. | G01R 31/3658 324/433 |
| 2012/0161710 A1* | 6/2012 | Mai | ...................... | B60L 11/1861 320/118 |
| 2013/0026994 A1* | 1/2013 | Morikawa | .......... | G01R 31/3658 320/134 |
| 2014/0152261 A1* | 6/2014 | Yamauchi | ........... | B60L 11/1866 320/118 |

FOREIGN PATENT DOCUMENTS

JP 2008295184 12/2008

* cited by examiner

*Primary Examiner* — Arun Williams
(74) *Attorney, Agent, or Firm* — Winston Hsu; Scott Margo

(57) ABSTRACT

A battery system balancing control method for performing balancing control with aid of reference voltage information and battery system are provided. The battery system balancing control method includes: after a specific reference resistor of a plurality of reference resistors is installed into a specific battery module of a set of battery modules connected in series within a power supply device and the reference resistors are electrically connected in series, converting a total voltage of the set of battery modules into the reference voltage information, wherein each battery module of the set of battery modules includes at least one battery cell, and the reference voltage information includes a plurality of sets of reference voltage levels respectively corresponding to the reference resistors; and performing balancing control of the specific battery module according to a set of reference voltage levels corresponding to the specific reference resistor within the sets of reference voltage levels.

20 Claims, 6 Drawing Sheets

BATTERY SYSTEM BALANCING CONTROL METHOD FOR PERFORMING BALANCING CONTROL WITH AID OF REFERENCE VOLTAGE INFORMATION AND BATTERY SYSTEM THEREOF

CROSS REFERENCE TO RELATED APPLICATIONS

This application claims the benefit of U.S. Provisional Application No. 61/769,754, which was filed on Feb. 27, 2013, and is included herein by reference.

BACKGROUND OF THE INVENTION

1. Field of the Invention

The present invention relates to a power supply device, and more particularly, to a battery system balancing control method for performing balancing control with aid of reference voltage information, and to an associated battery system.

2. Description of the Prior Art

In recent years, the environmental issues are widely discussed. In order to prevent the natural environment from becoming worse, it is encouraged to use more rechargeable batteries in many places. For example, electric vehicles (EVs) or hybrid electric vehicles (HEVs) are typical in many nations. Additionally, it seems unlikely that the conventional battery system having a single battery is suitable for implementing machines that are driven by high voltages, such as the EVs mentioned above, since it is typically needed to have a total voltage of tens or hundreds of volts for driving the EVs. As a result, connecting multiple batteries in series to form a serial connection battery system is required.

The problems encountered in the serial connection battery system are much different from that of a single battery. In the serial connection battery system, the electrical characteristics of respective batteries are not consistent. When the number of batteries that are connected in series within the serial connection battery system is increased, the influence due to the differences between the batteries may become greater, where the electricity imbalance between the respective batteries in the serial connection battery system may easily occur. For example, some of the batteries in the serial connection battery system may be overcharged. In another example, some of the batteries in the serial connection battery system may be over-discharged. As a result, the overall performance of the serial connection battery system may degrade, and the life of the serial connection battery system may be shortened. Therefore, electricity imbalance has become an issue.

In accordance with the related art, the balancing control circuit within the conventional serial connection battery system requires a special design, and some problems described in the following typically exist. For example, when it is required to change the number of batteries in the conventional serial connection battery system (e.g. the output voltage specifications of the conventional serial connection battery system need to be changed), the balancing control circuit needs to be modified accordingly. In addition, in a situation where the design of the balancing control circuit is updated in response to user requirements, mechanical elements within the conventional serial connection battery system (e.g. some case components) need to be modified accordingly. The situations described above may result in an increase of related costs, and typically, there is no the usage flexibility when implementing according to the related art.

SUMMARY OF THE INVENTION

It is therefore an objective of the present invention to provide a battery system balancing control method for performing balancing control with aid of reference voltage information, and to provide an associated battery system, in order to solve the above-mentioned problems.

It is another objective of the present invention to provide a battery system balancing control method for performing balancing control with aid of reference voltage information, and to provide an associated battery system, in order to realize automatic balancing between multiple battery modules without introducing undesirable side effects.

According to at least one preferred embodiment of the present invention, a battery system balancing control method for performing balancing control with aid of reference voltage information is provided, where the battery system balancing control method is applied to a power supply device. The battery system balancing control method comprises the steps of: after a first reference resistor of a plurality of reference resistors is installed into a first battery module of a set of battery modules connected in series within the power supply device and a second reference resistor of the plurality of reference resistors is installed into a second battery module of the set of battery modules and the reference resistors are electrically connected in series, converting a total voltage of the set of battery modules into the reference voltage information, wherein the first battery module comprises a first battery cell having a first battery voltage, the second battery module comprises a second battery cell having a second battery voltage, and the reference voltage information comprises a first set of reference voltage levels corresponding to the first reference resistor and a second set of reference voltage levels corresponding to the second reference resistor; and performing balancing control (e.g. active balancing control, and/or passive balancing control) of the first battery module according to the first set of reference voltage levels corresponding to the first reference resistor, and performing balancing control (e.g. active balancing control, and/or passive balancing control) of the second battery module according to the second set of reference voltage levels corresponding to the second reference resistor.

According to at least one preferred embodiment of the present invention, a battery system for performing balancing control with aid of reference voltage information is also provided, where the battery system comprises at least one portion of a power supply device. More particularly, the battery system comprises a first battery module, which is one of a set of battery modules connected in series within the power supply device, wherein the first battery module comprises: a first battery cell having a first battery voltage; a first reference resistor, which is one of a plurality of reference resistors electrically connected in series to convert a total voltage of the set of battery modules into the reference voltage information, wherein the first reference resistor of the plurality of reference resistors is installed into the first battery module to generate a first set of reference voltage levels, and the reference voltage information comprises the first set of reference voltage levels; and a first balancing control circuit, electrically connected to the first battery cell and the first reference resistor, arranged to perform balancing control of the first battery module according to the first set of reference voltage levels corresponding to the first reference resistor. In addition, the battery system further comprises a second battery module, which is another one of the set of battery modules connected in series within the power supply device, wherein the second battery module comprises: a second battery cell connected to the first battery cell in series and having a second battery voltage; a second reference resistor connected to the first reference resistor in series and being another one of the plurality of reference resistors electrically connected in series to convert the total voltage of the set of battery modules into the reference voltage information, wherein the second reference resistor of the plurality of reference resistors is installed into the second battery module to generate a second set of reference voltage levels, and the reference voltage information comprises the second set of reference voltage levels; and a second balancing control circuit, electrically connected to the second battery cell and the second reference resistor, arranged to perform balancing control of the second battery module according to the second set of reference voltage levels corresponding to the second reference resistor.

It is an advantage of the present invention that the battery system balancing control method and battery system for performing balancing control with aid of reference voltage information may realize automatic balancing between multiple battery modules without introducing undesirable side effects. In addition, the proposed battery system balancing control method and battery system are not limited by the number of the battery modules, and may realize self-balancing of a power supply device having multiple battery modules. Thus, a power supply device implemented according to the proposed battery system balancing control method and battery system may provide high voltage outputs, and the problem of a severely shortened life in a weaker battery module will not occur. The proposed battery system balancing control method and battery system are beneficial for manufacturing, testing, installation, usage, servicing (e.g. replacing failed battery module(s)) and/or flexibility promotion (e.g. changing output specifications by adding or removing at least one battery module) of the power supply device. Additionally, based on the proposed battery system balancing control method and battery system, a power supply device can be easily implemented, and the goal of low cost can be achieved, where there is no need for inter-module communications and there is no accumulative error. The power supply device implemented based on the proposed battery system balancing control method and battery system is configurable through modularization, and the balancing speed can be minimally impacted by the number of cascaded battery modules.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
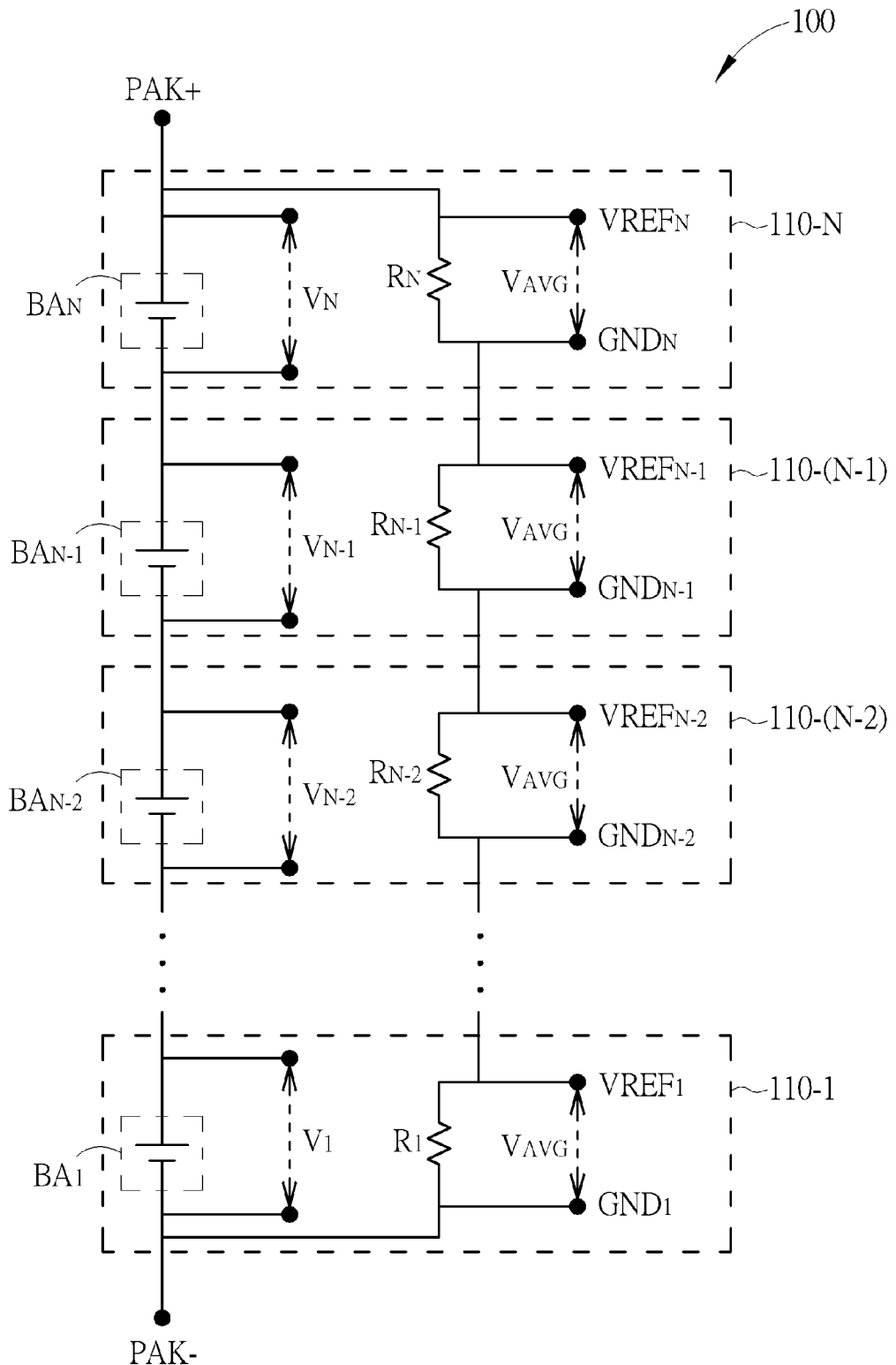
FIG. 1 is a diagram of a battery system for performing balancing control with aid of reference voltage information according to an embodiment of the present invention.

FIG. 1 is a diagram of a battery system 100 for performing balancing control with aid of reference voltage information according to an embodiment of the present invention. The battery system 100 may include at least one portion (e.g. a portion or all) of a power supply device, where the power supply device can be, for example but not limited to, a redundant power supply. In one example, the battery system 100 may represent an electrical system within the power supply device, and the electrical system may include at least one control circuit of the power supply device. In another example, the battery system 100 may represent the whole of the power supply device. This is for illustrative purposes only, and is not meant to be a limitation of the present invention. According to a variation of this embodiment, the battery system 100 may represent all parts of the electrical system excluding batteries (e.g. the aforementioned at least one control circuit). According to another variation of this embodiment, the battery system 100 may represent a system including the power supply device, where the power supply device is a sub-system of the system.

According to this embodiment, the battery system 100 may comprise a set of battery modules {110-$n$} connected in series within the power supply device, such as the battery modules {110-N, 110-(N−1), 110-(N−2), ..., 110-1} shown in FIG. 1, where the notation N may represent a positive integer that is greater than one, and the index n may represent a positive integer that falls within the range of the interval [1, N]. In addition, each battery module of the set of battery modules mentioned above, such as the battery module 110-$n$ within the battery modules {110-N, 110-(N−1), 110-(N−2), ..., 110-1}, may comprise at least one battery cell (e.g. one or more battery cells). No matter whether the battery module 110-$n$ comprises a single battery cell or multiple battery cells, the aforementioned at least one battery cell of the battery module 110-$n$ can be referred to as the battery cell $BA_n$, for brevity. As illustrated in FIG. 1, the battery cells $BA_N$, $BA_{N-1}$, $BA_{N-2}$, ..., and $BA_1$ are positioned in the battery modules 110-N, 110-(N−1), 110-(N−2), ..., and 110-1, respectively. More particularly, the battery cells $BA_N$, $BA_{N-1}$, $BA_{N-2}$, ..., and $BA_1$ are positioned in the cases of the battery modules 110-N, 110-(N−1), 110-(N−2), ..., and 110-1, respectively, where the battery cells {$BA_N$, $BA_{N-1}$, $BA_{N-2}$, ..., $BA_1$} are electrically connected in series. Additionally, the battery voltage $V_R$ between the two terminals of the battery cells $BA_n$, such as any of the battery voltages $V_N$, $V_{N-1}$, $V_{N-2}$, ..., and $V_1$ respectively corresponding to the battery cells $BA_N$, $BA_{N-1}$, $BA_{N-2}$, ..., and $BA_1$, can be adjusted based on balancing control (e.g. active balancing control, and/or passive balancing control) of the battery module 110-$n$.

As shown in FIG. 1, the battery system 100 may further comprise a plurality of reference resistors {R} such as the reference resistors {$R_N$, $R_{N-1}$, $R_{N-2}$, ..., and $R_1$}, for use of the aforementioned balancing control. Typically, the resistance values of any two reference resistors within the plurality of reference resistors {R} are equal to each other. For example, the plurality of reference resistors {R} such as the reference resistors {$R_N$, $R_{N-1}$, $R_{N-2}$, ..., and $R_1$} can be a string of high-precision and equal-value resistors that are connected in series across the positive terminal and the negative terminal of the whole of the battery cells {$BA_N$, $BA_{N-1}$, $BA_{N-2}$, ..., $BA_1$}, such as the system battery terminals PAK+ and PAK− in this embodiment. In practice, the reference resistors {R} are electrically connected in series to convert the total voltage of the set of battery modules (i.e. the total voltage of the battery cells {$BA_N$, $BA_{N-1}$, $BA_{N-2}$, ..., $BA_1$} of the battery modules {110-N, 110-(N−1), 110-(N−2), ..., 110-1}) into the reference voltage information mentioned above, where the reference voltage information may comprise a plurality of sets of reference voltage levels respectively corresponding to the reference resistors {R}, such as those of the sets of terminals {$VREF_N$, $GND_N$}, {$VREF_{N-1}$, $GND_{N-1}$}, {$VREF_{N-2}$, $GND_{N-2}$}, ..., and {$VREF_1$, $GND_1$} shown in FIG. 1. For better comprehension, the reference voltage levels at the sets of terminals {$VREF_N$, $GND_N$}, {$VREF_{N-1}$, $GND_{N-1}$}, {$VREF_{N-2}$, $GND_{N-2}$}, ..., and {$VREF_1$, $GND_1$} shown in FIG. 1 can be written as the sets of reference voltage levels {$VREF_N$, $GND_N$}, {$VREF_{N-1}$, $GND_{N-1}$}, {$VREF_{N-2}$, $GND_{N-2}$}, ..., and {$VREF_1$, $GND_1$}, respectively.

In this embodiment, the voltage across each of the resistors {R} can be the reference voltage $V_{AVG}$ that each battery block such as the battery cell $BA_n$ of the battery cells {$BA_N$, $BA_{N-1}$, $BA_{N-2}$, ..., $BA_1$} shown in FIG. 1 should have if all battery blocks such as the battery cells {$BA_N$, $BA_{N-1}$, $BA_{N-2}$, ..., $BA_1$} are balanced, where the reference voltage $V_{AVG}$ can be referred to as the average voltage, for brevity. More particularly, when the battery voltage Vx of a specific battery block shown in FIG. 1, such as a battery cell $BA_X$ within the battery cells {$BA_N$, $BA_{N-1}$, $BA_{N-2}$, ..., $BA_1$} shown in FIG. 1 (i.e. the aforementioned at least one cell of a specific battery module 110-X, which is one of the set of battery modules {110-N, 110-(N−1), 110-(N−2), ..., 110-1}, such as any battery module of the set of battery modules {110-N, 110-(N−1), 110-(N−2), ..., 110-1}), exceeds the average voltage $V_{AVG}$ by a predetermined value such as a preset value ($V_{AVG}+\Delta_1$), a balancing circuit (e.g. a passive balancing circuit or an active balancing circuit) within the specific battery module 110-X can be activated to remove from or add to energies of the battery block of the specific battery module 110-X, thus reducing or increasing the battery voltage $V_X$ until it drops below or rise above another preset value, ($V_{AVG}-\Delta_2$).

For example, when it is detected that the battery voltage Vx is greater than the average voltage $V_{AVG}$ by a predetermined value such as a preset value ($V_{AVG}+\Delta_1$), the aforementioned balancing circuit within the specific battery module 110-X can be activated to remove energies from the battery block of the specific battery module 110-X, thus reducing the battery voltage $V_X$ until it drops below another predetermined value such as a preset value, ($V_{AVG}-\Delta_2$). This is for illustrative purposes only, and is not meant to be a limitation of the present invention. In another example, when it is detected that the battery voltage Vx is less than the average voltage $V_{AVG}$ by a predetermined value such as a preset value ($V_{AVG}-\Delta_1$), a aforementioned balancing circuit within the specific battery module 110-X can be activated to add energies to the battery block of the specific battery module 110-X, thus increasing the battery voltage $V_X$ until it rise above another predetermined value such as a preset value ($V_{AVG}+\Delta_2$).

Based on the architecture shown in FIG. 1, the power supply device can be easily implemented, and the goal of low cost can be achieved, where there is no need for inter-module communications and there is no accumulative error. In addition, the power supply device implemented based on the architecture shown in FIG. 1 is configurable through modularization, and the balancing speed can be minimally impacted by the number N of cascaded battery modules.

Figure 2:
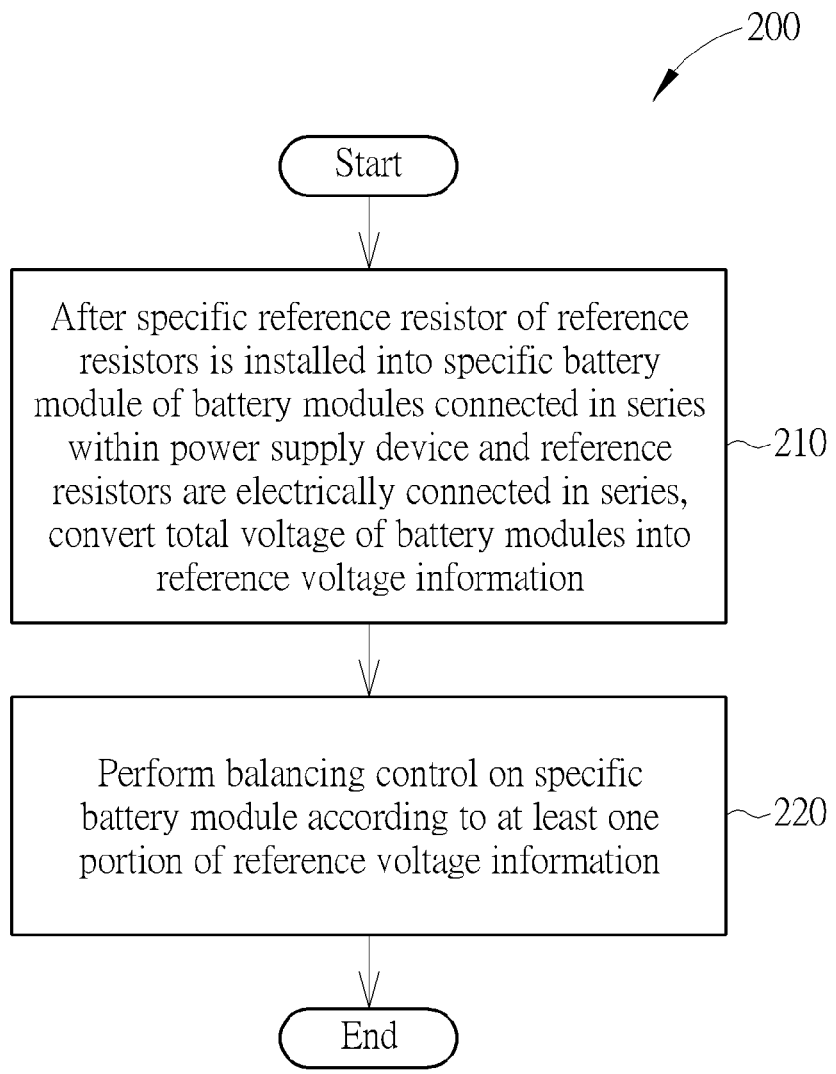
FIG. 2 illustrates a battery system balancing control method of the battery system shown in FIG. 1.

FIG. 2 illustrates a battery system balancing control method 200 for performing balancing control with aid of reference voltage information according to an embodiment of the present invention. The battery system balancing control method 200 can be applied to the battery system 100 shown in FIG. 1. The battery system balancing control method 200 is described below.

In Step 210, after a specific reference resistor R of the plurality of reference resistors {R} is installed into the specific battery module 110-X of the set of battery modules {110-N, 110-(N−1), 110-(N−2), ..., 110-1} connected in series within the power supply device and the reference resistors {R} are electrically connected in series, the plurality of reference resistors {R} converts the total voltage of the set of battery modules {110-N, 110-(N−1), 110-(N−2), ..., 110-1} into the reference voltage information. For example, the reference voltage information mentioned above may comprise the sets of reference voltage levels {$VREF_N$, $GND_N$}, {$VREF_{N-1}$, $GND_{N-1}$}, {$VREF_{N-2}$, $GND_{N-2}$}, ..., and {$VREF_1$, $GND_1$} at the sets of terminals {$VREF_N$, $GND_N$}, {$VREF_{N-1}$, $GND_{N-1}$}, {$VREF_{N-2}$, $GND_{N-2}$}, ..., and {$VREF_1$, $GND_1$}, respectively, where the aforementioned total voltage of the set of battery modules {110-N, 110-(N−1), 110-(N−2), ..., 110-1} can be the battery voltage Vo between the system battery terminals PAK+ and PAK− mentioned above.

In Step 220, the battery system 100 performs balancing control (e.g. active balancing control, and/or passive balancing control) on the specific battery module 110-X according to at least one portion (e.g. a portion or all) of the reference voltage information. More particularly, the balancing control circuit in the specific battery module 110-X performs balancing control (e.g. active balancing control, and/or passive balancing control) of the specific battery module 110-X according to a set of reference voltage levels corresponding to the specific reference resistor mentioned in Step 210 within the sets of reference voltage levels {$VREF_N$, $GND_N$}, {$VREF_{N-1}$, $GND_{N-1}$}, {$VREF_{N-2}$, $GND_{N-2}$}, ..., and {$VREF_1$, $GND_1$} at the sets of terminals {$VREF_N$, $GND_N$}, {$VREF_{N-1}$, $GND_{N-1}$}, {$VREF_{N-2}$, $GND_{N-2}$}, ..., and {$VREF_1$, $GND_1$}, such as the set of reference voltage levels {$VREF_X$, $GND_X$} at the set of terminals {$VREF_X$, $GND_X$} within the specific battery module 110-X.

As shown in FIG. 2, the battery system balancing control method 200 can be described with respect to the specific reference resistor R mentioned above. This is for illustrative purposes only, and is not meant to be a limitation of the present invention. Please note that the battery system balancing control method 200 may be varied, where the operations of Step 210 and Step 220 may be performed with respect to two or more reference resistors of the plurality of reference resistors {R}. More particularly, according to some embodiments of the present invention, the battery system balancing control method 200 may comprise the steps of: after a first reference resistor of the plurality of reference resistors {R} is installed into a first battery module of the set of battery modules {110-N, 110-(N−1), 110-(N−2), ..., 110-1} connected in series within the power supply device and a second reference resistor of the plurality of reference resistors {R} is installed into a second battery module of the set of battery modules {110-N, 110-(N−1), 110-(N−2), ..., 110-1} and the reference resistors {R} are electrically connected in series, the plurality of reference resistors {R} converts the total voltage of the set of battery modules {110-N, 110-(N−1), 110-(N−2), ..., 110-1} into the reference voltage information, where the first battery module comprises a first battery cell having a first battery voltage, the second battery module comprises a second battery cell having a second battery voltage, and the reference voltage information comprises a first set of reference voltage levels corresponding to the first reference resistor and a second set of reference voltage levels corresponding to the second reference resistor; and the battery system 100 performs balancing control (e.g. active balancing control, and/or passive balancing control) of the first battery module according to the first set of reference voltage levels corresponding to the first reference resistor, and performs balancing control (e.g. active balancing control, and/or passive balancing control) of the second battery module according to the second set of reference voltage levels corresponding to the second reference resistor. For example, the resistance error value of the first reference resistor can be less than 0.1%. In another example, the resistance value of the first reference resistor can be greater than 1000 ohms. In another example, the resistance value of the first reference resistor can be greater than 1000 ohms, where the resistance error value of the first reference resistor can be less than 0.1%.

According to some embodiments of the present invention, when the first battery voltage is greater than a first reference voltage corresponding to a voltage difference between the first set of reference voltage levels, the first balancing control circuit controls the first battery cell to discharge. This is for illustrative purposes only, and is not meant to be a limitation of the present invention. According to some embodiments of the present invention, the first reference resistor can be divided into a first resistor, a second resistor, and a third resistor, and each of the resistance value of the first resistor and the resistance value of the third resistor is equivalent to two-fifth of the resistance value of the first reference resistor, and the resistance value of the second resistor is equivalent to one-fifth of the resistance value of the first reference resistor. More particularly, based on the first reference voltage corresponding to the voltage difference between the first set of reference voltage levels, the first balancing control circuit selectively controls the first battery cell to discharge, where the first reference voltage can be the voltage difference between two terminals of the second resistor.

According to some embodiments of the present invention, based on the first reference voltage corresponding to the voltage difference between the first set of reference voltage levels, the first balancing control circuit selectively controls the first battery cell to discharge, where the first balancing control circuit may comprise a first comparator. In addition, the first comparator may comprise a positive terminal and a negative terminal, where the first reference voltage is input into the positive terminal, and the first battery voltage is input into the negative terminal. For example, the input impedance of the first comparator can be greater than 1 giga-ohm.

According to some embodiments of the present invention, the first balancing control circuit can be a passive balancing control circuit. This is for illustrative purposes only, and is not meant to be a limitation of the present invention. According to some embodiments of the present invention, the first balancing control circuit is an active balancing control circuit.

Figure 3:
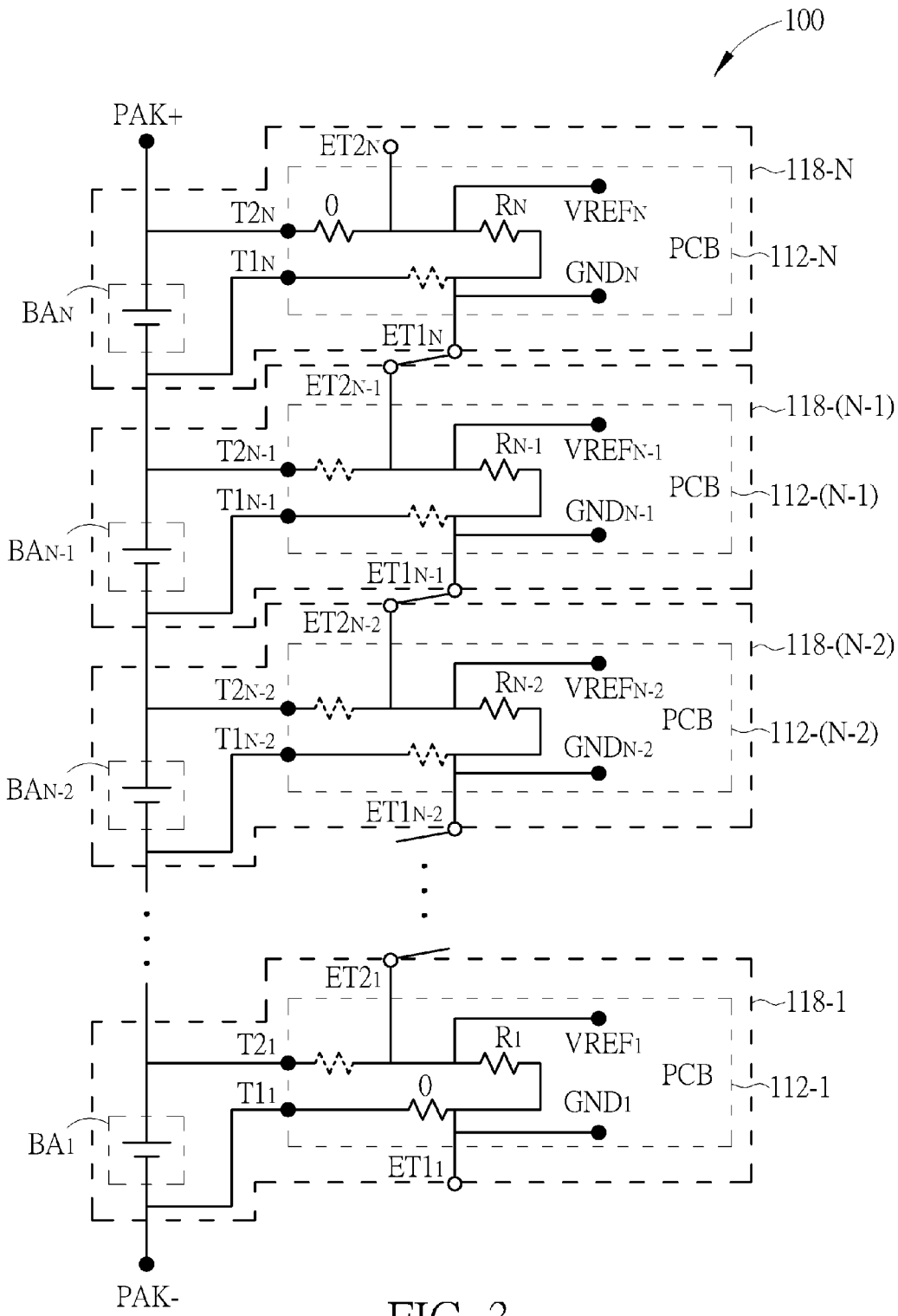
FIG. 3 illustrates a detailed diagram of the battery system shown in FIG. 1.

FIG. 3 illustrates a detailed diagram of the battery system shown in FIG. 1, where a control scheme involved with the battery system balancing control method 200 shown in FIG. 2 is also disclosed in this embodiment. As shown in FIG. 3, each battery module of the set of battery modules {110-N, 110-(N−1), 110-(N−2), . . . , 110-1}, such as the battery module 110-$n$, may comprise a printed circuit board (PCB) (e.g. the corresponding PCB 112-$n$ within the PCBs {112-N, 112-(N−1), 112-(N−2), . . . , 112-1}), and may further comprise a case (e.g. the corresponding case 118-$n$ within the cases {118-N, 118-(N−1), 118-(N−2), . . . , 118-1}). In addition, the case of each battery module of the set of battery modules {110-N, 110-(N−1), 110-(N−2), . . . , 110-1}, such as the case 118-$n$ of this battery module 110-$n$, may comprise two external terminals $ET2_n$ and $ET1_n$ that are electrically connected to the two terminals of the reference resistor R mounted on the PCB 112-$n$, respectively. Please note that the sets of external terminals {$ET2_N$, $ET1_N$}, {$ET2_{N-1}$, $ET1_{N-1}$}, {$ET2_{N-2}$, $ET1_{N-2}$}, . . . , and {$ET2_1$, $ET1_1$} are utilized for electrically connecting the plurality of reference resistors {R} such as the reference resistors {$R_N$, $R_{N-1}$, $R_{N-2}$, . . . , and $R_1$} in series.

According to this embodiment, the plurality of reference resistors {R} mentioned above, such as the reference resistors {$R_N$, $R_{N-1}$, $R_{N-2}$, . . . , and $R_1$}, are mounted on the PCBs {112-N, 112-(N−1), 112-(N−2), . . . , 112-1} of the set of battery modules {110-N, 110-(N−1), 110-(N−2), . . . , 110-1}, respectively. Thus, the aforementioned PCB 112-$n$ is utilized for mounting one of the plurality of reference resistors {R}, such as the reference resistor R in the battery module 110-$n$. In addition, the aforementioned case 118-$n$ is arranged to protect one or more components of this battery module 110-$n$, and more particularly, to protect the PCB 112-$n$ and the reference resistor R mounted on the PCB 112-$n$, where the aforementioned one or more components of this battery module 110-$n$ may comprise the PCB 112-$n$ and the reference resistor R mounted on the PCB 112-$n$. For example, the specific battery module 110-X comprises a case 118-X arranged to protect one or more components of the specific battery module 110-X, such as the PCB 112-X and the reference resistor R mounted on the PCB 112-X. The case 118-X of the specific battery module 110-X may comprise two external terminals $ET2_X$ and $ET1_X$ that are electrically connected to two terminals of the specific reference resistor R mounted on the PCB 112-X, respectively, where at least one external terminal of the two external terminals $ET2_X$ and $ET1_X$ is utilized for electrically connecting the plurality of reference resistors {R} in series.

In practice, any two PCBs of the PCBs {112-N, 112-(N−1), 112-(N−2), . . . , 112-1} may have the same layout, in order to save related costs. As shown in FIG. 3, the PCB of the each battery module, such as the PCB 112-$n$ of the aforementioned battery module 110-$n$, may comprise a first internal terminal $T1_n$ and a second internal terminal $T2_n$ that are electrically connected to the two terminals of the battery cell $BA_n$ of this battery module 110-$n$. In this embodiment, the sets of internal terminals {$T2_N$, $T1_N$}, {$T2_{N-1}$, $T1_{N-1}$}, {$T2_{N-2}$, $T1_{N-2}$}, . . . , and {$T2_1$, $T1_1$} are positioned at one side of the PCBs 112-N, 112-(N−1), 112-(N−2), . . . , and 112-1, respectively. This is for illustrative purposes only, and is not meant to be a limitation of the present invention. According to some variations of this embodiment, the positions of the sets of internal terminals {$T2_N$, $T1_N$}, {$T2_{N-1}$, $T1_{N-1}$}, {$T2_{N-2}$, $T1_{N-2}$}, . . . , and {$T2_1$, $T1_1$} on the PCBs 112-N, 112-(N−1), 112-(N−2), . . . , and 112-1 may vary.

More particularly, regarding the specific battery module 110-X mentioned in Step 210, the PCB 112-X of the specific battery module 110-X comprises the first internal terminal $T1_X$ and the second internal terminal $T2_X$ that are electrically connected to the two terminals of the battery cell $BA_X$ of the specific battery module 110-X. For example, in a situation where the specific battery module 110-X is the first battery module 110-1 within the set of battery modules {110-N, 110-(N−1), 110-(N−2), . . . , 110-1} connected in series, a wire (e.g. the resistor labeled "0", which stands for the resistant value thereof is equal to zero) is mounted onto the PCB 112-X of the specific battery module 110-X, such as the PCB 112-1 of the specific battery module 110-1, to electrically connect the first internal terminal $T1_1$ to one of the two terminals of the specific reference resistor R mounted on the PCB 112-1, and the second internal terminal $T2_1$ is not electrically connected to the other of the two terminals of the aforementioned specific reference resistor such as the reference resistor R mounted on the PCB 112-1. In another example, in a situation where the specific battery module 110-X is not any of the first battery module 110-1 and the last battery module 110-N within the set of battery modules {110-N, 110-(N−1), 110-(N−2), . . . , 110-1} connected in series, the first internal terminal $T1_X$ is not electrically connected to one of the two terminals of the specific reference resistor R mounted on the PCB 112-X of the specific battery module 110-X, and the second internal terminal $T2_X$ is not electrically connected to the other of the two terminals of the specific reference resistor R mounted on the PCB 112-X of the specific battery module 110-X. In another example, in a situation where the specific battery module 110-X is the last battery module 110-N within the set of battery modules {110-N, 110-(N−1), 110-(N−2), . . . , 110-1} connected in series, a wire (e.g. the resistor labeled "0", which stands for the resistant value thereof is equal to zero) is mounted onto the PCB 112-X of the specific battery module 110-X, such as the PCB 112-N of the specific battery module 110-N, to electrically connect the second internal terminal $T2_N$ to one of the two terminals of the specific reference resistor R mounted on the PCB 112-N, and the first internal terminal $T1_N$ is not electrically connected to the other of the two terminals of the aforementioned specific reference resistor such as the reference resistor R mounted on the PCB 112-N.

Please note that, regarding the specific battery module 110-X mentioned in Step 210, the reference voltage levels {$VREF_X$, $GND_X$} at the set of terminals {$VREF_X$, $GND_X$} can be utilized as the voltage reference for the corresponding battery block shown in FIG. 3, such as the battery cell $BA_X$ within the specific battery module 110-X, in implementing battery block balance. For example, the battery system 100 may operate according to the following equation:

$$(VREF_X - GND_X) = (Vo/N);$$

where the notation Vo in the above equation may represent the corresponding pack voltage (e.g. the battery voltage Vo mentioned above), and the notation N in the above equation may represent the number of battery blocks that are connected in series (e.g. the number of battery modules in the set of battery modules {110-N, 110-(N−1), 110-(N−2), . . . , 110-1} mentioned above). In practice, the resistors {R} should be high accuracy resistors, and the impedance introduced by the internal circuit in the battery block should be large relative to the resistor R to minimize the effect on the reference voltage level $VREF_X$, and more particularly, the voltage difference ($VREF_X - GND_X$). For example, the resistors {R} can be resistors having errors within 0.1%, respectively. This is for illustrative purposes only, and is not meant to be a limitation of the present invention. In another example, the resistors {R} can be resistors having errors within 0.5%, respectively.

Figure 4:
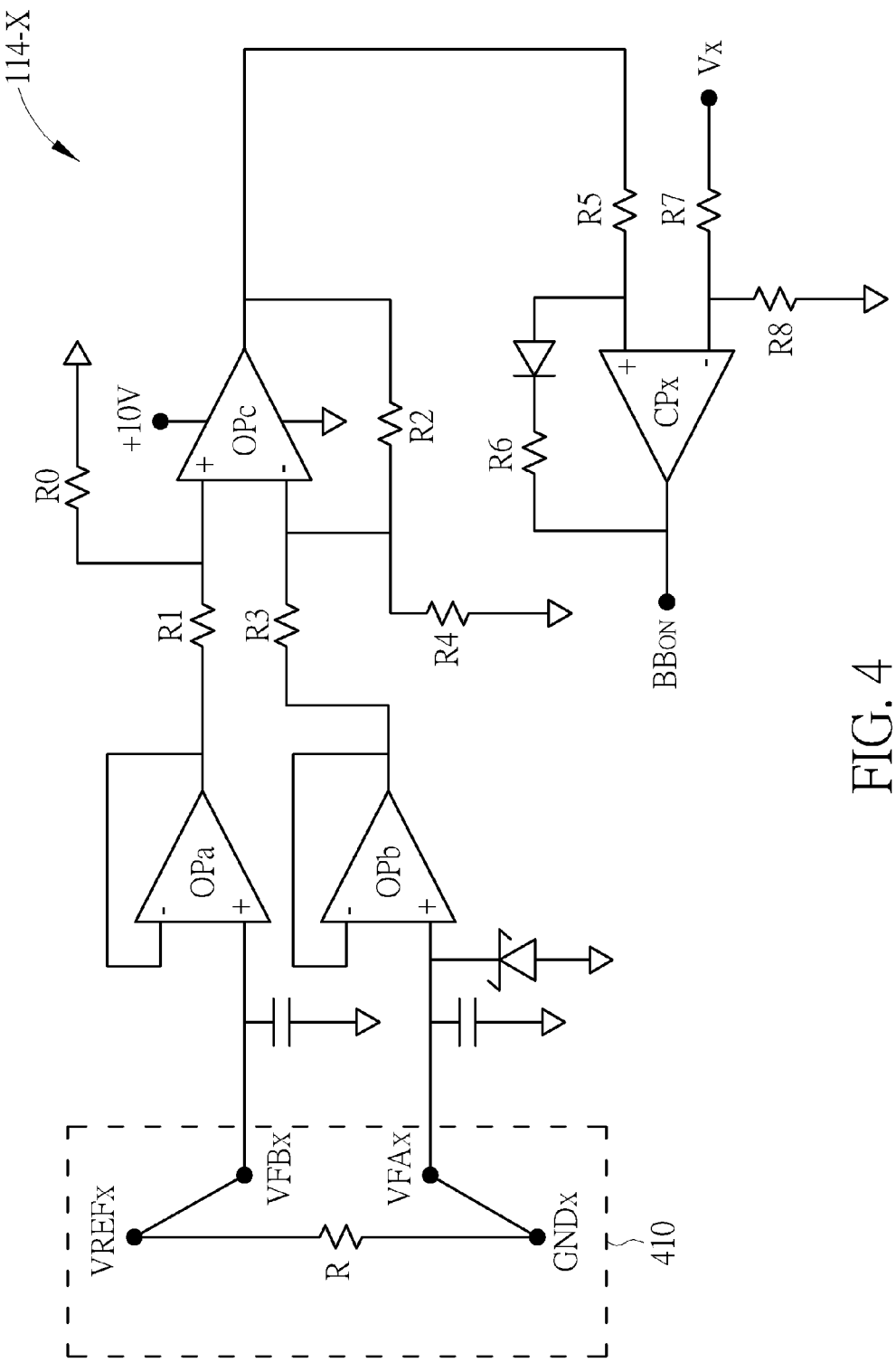
FIG. 4 illustrates a balancing control circuit diagram of the battery system shown in FIG. 1.

FIG. 4 illustrates a balancing control circuit diagram of the battery system shown in FIG. 1, where a control scheme involved with the battery system balancing control method 200 shown in FIG. 2 is also disclosed. In this embodiment, the battery system 100 may comprise at least one balancing control circuit arranged to perform balancing control for at least one battery module in the set of battery modules {110-N, 110-(N−1), 110-(N−2), . . . , 110-1}. For example, the specific battery module 110-X mentioned above may comprise at least one balancing control circuit (e.g. an active balancing control circuit, and/or a passive balancing control circuit), electrically connected to the specific reference resistor, arranged to perform balancing control (e.g. active balancing control, and/or passive balancing control) of the specific battery module 110-X according to a set of reference voltage levels corresponding to the specific reference resistor mentioned above, such as the reference voltage levels {$VREF_X$, $GND_X$} at the set of terminals {$VREF_X$, $GND_X$}. In practice, the aforementioned at least one balancing control circuit of the specific battery module 110-X can be implemented by utilizing the PCB 112-X of the specific battery module 110-X, and more particularly, may comprise a portion of the PCB 112-X and some of the components mounted on the PCB 112-X.

The architecture shown in FIG. 4 can be taken as an example of the aforementioned at least one balancing control circuit of the specific battery module 110-X. As shown in FIG. 4, the balancing control circuit 114-X may comprise a plurality of operational amplifiers OPa, OPb, and OPc, and a comparator CPx, and may further comprise a plurality of impedance components, where the plurality of impedance components comprises some capacitors (e.g. those illustrated in the left haft of FIG. 4) and some resistors such as the resistors R, R0, R1, R2, R3, R4, R5, R6, R7, and R8 in FIG. 4. In addition, the balancing control circuit 114-X may further comprise some diodes (e.g. the diode electrically connected to the positive input terminal of the comparator CPx, and the Zener diode electrically connected to the positive input terminal of the operational amplifier OPb. Please note that the triangle ground notation illustrated in FIG. 4 can be regarded as the local ground of the specific battery module 110-X, such as the reference voltage level $GND_X$ at the terminal $GND_X$, and the reference voltage level +10V illustrated in FIG. 4 is a voltage level that is 10V greater than the reference voltage level $GND_X$ at the terminal $GND_X$.

Within the voltage dividing module 410 shown in FIG. 4, the arrangement of resistor configuration in the voltage dividing module 410 can be utilized for providing the reference voltage through the terminals VFBx and VFAx, where the terminal VFBx can be electrically connected to the terminal $VREF_X$, and the terminal VFAx can be electrically connected to the terminal $GND_X$. This is for illustrative purposes only, and is not meant to be a limitation of the present invention. In another example, the resistor configuration in the voltage dividing module 410 may vary. In addition, as the resistance value of the voltage dividing module 410 is equal to the resistance value of the specific reference resistor R mounted on the PCB 112-X, the voltage levels at the output terminals of the operational amplifiers OPa and OPb can be $V_X$ and 0, respectively, with respect to the local ground of the specific battery module 110-X (i.e. the reference voltage level $GND_X$ at the terminal $GND_X$). For better comprehension, the local ground such as the reference voltage level $GND_X$ at the terminal $GND_X$ can be regarded as zero, and therefore the battery voltage $V_X$ (i.e., ($VREF_X - GND_X$)) can be regarded as $VREF_X$, for brevity.

As a result of the operations of the architecture shown in FIG. 4, the balancing control circuit 114-X of the specific battery module 110-X generates a block balancing turn-on signal at the control terminal $BB_{ON}$ of the balancing control circuit 114-X, in order to control whether the block balancing of the specific battery module 110-X should be turned on (or enabled). For example, the block balancing of the specific battery module 110-X can be enabled when this block balancing turn-on signal is at a low level, and can be disabled when this block balancing turn-on signal is at a high level. This is for illustrative purposes only, and is not meant to be a limitation of the present invention. According to some variations of this embodiment, the block balancing of the specific battery module 110-X can be enabled when this block balancing turn-on signal is at a high level, and can be disabled when this block balancing turn-on signal is at a low level.

In practice, all resistors in the balancing control circuit 114-X can be resistors having errors within 0.1%, respectively. This is for illustrative purposes only, and is not meant to be a limitation of the present invention. In another example, all resistors in the balancing control circuit 114-X can be resistors having errors within 0.5%, respectively. In addition, the aforementioned balancing circuit (e.g. the passive balancing circuit or the active balancing circuit mentioned above) within the specific battery module 110-X can be utilized for selectively performing the block balancing of the specific battery module 110-X under control of the balancing control circuit 114-X. For brevity, similar descriptions are not repeated in detail for this embodiment.

Figure 5:
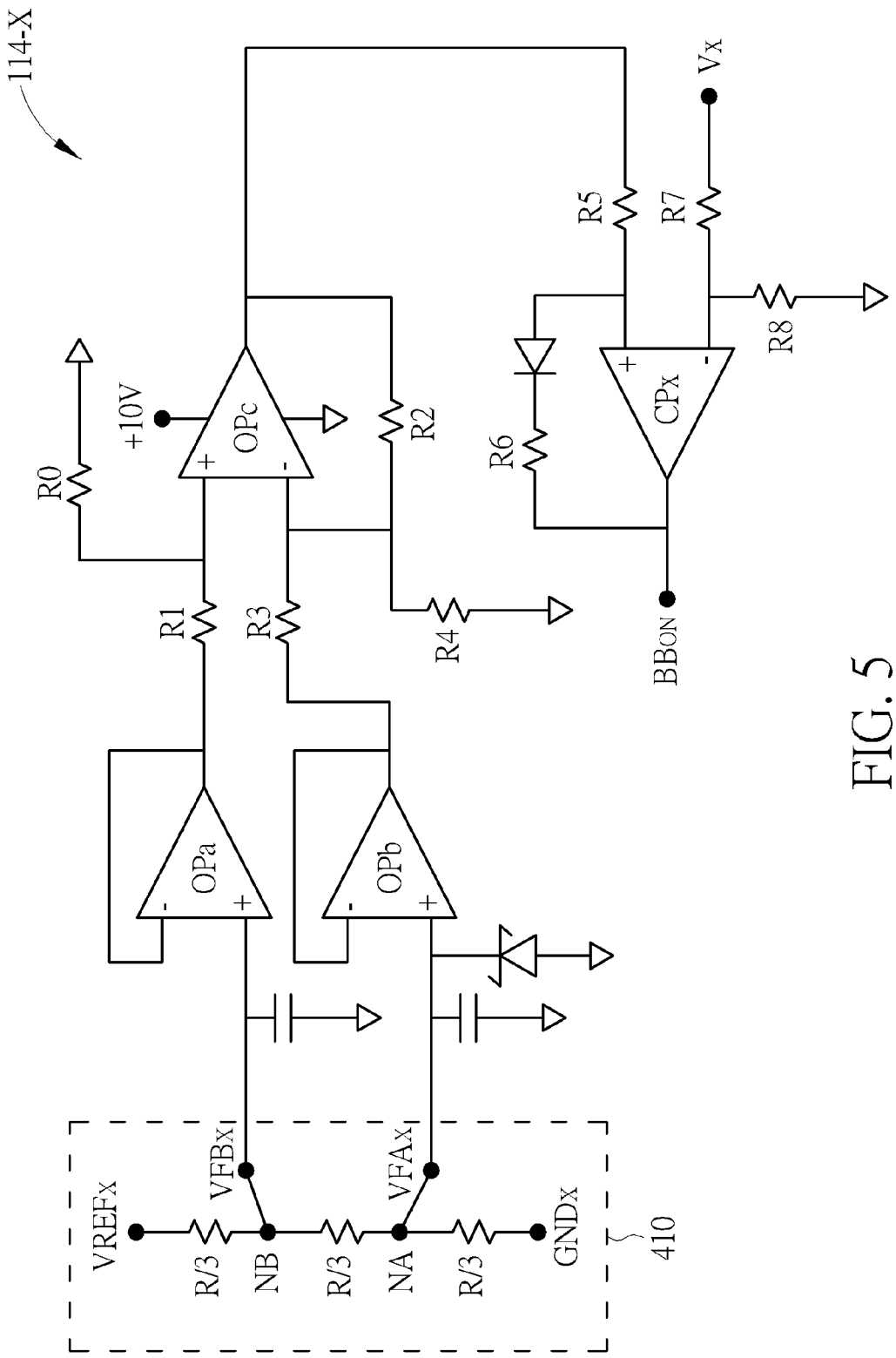
FIG. 5 illustrates another balancing control circuit diagram of the battery system shown in FIG. 1.

FIG. 5 illustrates another balancing control circuit diagram of the battery system shown in FIG. 1, where a control scheme involved with the battery system balancing control method 200 shown in FIG. 2 is also disclosed. As shown in FIG. 5, most components in the architecture shown in FIG. 5 can be the same as that in the architecture shown in FIG. 4. Please note that, in this embodiment, the terminal VFBx can be electrically connected to the terminal NB, and the terminal VFAx can be electrically connected to the terminal NA. Within the voltage dividing module 410 shown in FIG. 5, the arrangement of resistor configuration of the set of resistors labeled "R/3" can be utilized for adjusting the common mode range of the terminals VFBx and VFAx. The resistance value of each of the set of resistors labeled "R/3" is equal to one third (i.e. ⅓) the resistance value of the specific reference resistor R mounted on the PCB 112-X. This is for illustrative purposes only, and is not meant to be a limitation of the present invention. In another example, the resistor ratios in the voltage dividing module 410 may vary. In addition, as the resistance value of each of the set of resistors labeled "R/3" is equal to one third (i.e. ⅓) the resistance value of the specific reference resistor R mounted on the PCB 112-X, the voltage levels at the output terminals of the operational amplifiers OPa and OPb can be $(2/3)V_X$ and $(1/3)V_X$, respectively, with respect to the local ground of the specific battery module 110-X (i.e. the reference voltage level $GND_X$ at the terminal $GND_X$). For better comprehension, the local ground such as the reference voltage level $GND_X$ at the terminal $GND_X$ can be regarded as zero, and therefore the battery voltage $V_X$ (i.e., ($VREF_X - GND_X$)) can be regarded as $VREF_X$, for brevity. In addition, the resistance values of the resistors {R0, R1, R2, R3, R4, R5, R6, R7, R8} can be written as {R0, R1, R2, R3, R4, R5, R6, R7, R8}, respectively. For example, the voltage level $VR_X$ at the output terminal of the operational amplifier OPc can be written as follows:

$$VR_X = \{[(2*VREF_X/3) - (VREF_X/3)]/R3\} *$$
$$R2 + (2*VREF_X/3)$$
$$= [R2/R4 + 1]*(VREF_X/3)$$
$$= 0.5*VREF_X, \text{ if}$$

$$R4 = 2*R2.$$

As a result of the operations of the architecture shown in FIG. 5, the balancing control circuit 114-X of the specific battery module 110-X generates a block balancing turn-on signal at the control terminal $BB_{ON}$ of the balancing control circuit 114-X, in order to control whether the block balancing of the specific battery module 110-X should be turned on (or enabled). For example, the block balancing of the specific battery module 110-X can be enabled when this block balancing turn-on signal is at a low level, and can be disabled when this block balancing turn-on signal is at a high level. This is for illustrative purposes only, and is not meant to be a limitation of the present invention. According to some variations of this embodiment, the block balancing of the specific battery module 110-X can be enabled when this block balancing turn-on signal is at a high level, and can be disabled when this block balancing turn-on signal is at a low level.

In practice, all resistors in the balancing control circuit 114-X can be resistors having errors within 0.1%, respectively. This is for illustrative purposes only, and is not meant to be a limitation of the present invention. In another example, all resistors in the balancing control circuit 114-X can be resistors having errors within 0.5%, respectively. In addition, the aforementioned balancing circuit (e.g. the passive balancing circuit or the active balancing circuit mentioned above) within the specific battery module 110-X can be utilized for selectively performing the block balancing of the specific battery module 110-X under control of the balancing control circuit 114-X. For brevity, similar descriptions are not repeated in detail for this embodiment.

Figure 6:
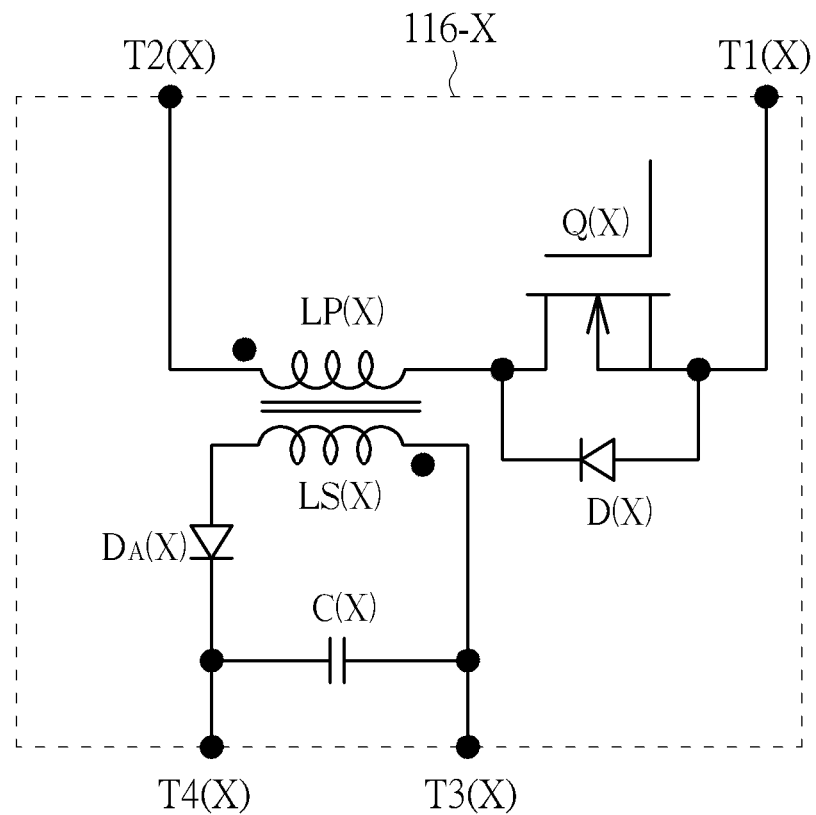
FIG. 6 illustrates a balancing circuit diagram of the battery system shown in FIG. 1.

FIG. 6 illustrates a balancing circuit diagram of the battery system shown in FIG. 1, where a balancing circuit involved with the battery system balancing control method 200 shown in FIG. 2 is also disclosed in this embodiment. The architecture shown in FIG. 6 can be taken as an example of the balancing circuit mentioned above, and can be utilized for selectively performing the aforementioned block balancing of the specific battery module 110-X under control of the balancing control circuit 114-X.

As shown in FIG. 6, the balancing circuit 116-X may comprise a plurality of windings LP(X) and LS(X) (which correspond to a primary side and a secondary side, respectively), and further comprise a switch (e.g. a metal-oxide-semiconductor field-effect transistor (MOSFET) Q(X)), a diode D(X) connected in series with the switch, an energy temporary storage unit (e.g. at least one capacitor C(X)) and another diode $D_A(X)$), where the energy temporary storage unit is coupled to the winding LS(X) corresponding to the secondary side. As shown in FIG. 6, two terminals of the capacitor C(X) are coupled to two terminals of the winding LS(X) corresponding to the secondary side, respectively. In this embodiment, the capacitor C(X) is taken as an example of the energy temporary storage unit. This is for illustrative purposes only, and is not meant to be a limitation of the present invention. According to some variations of the present invention, the architecture of the energy temporary storage unit may be varied. In one example, the energy temporary storage unit may include a plurality of capacitors {C(X)}. In another example, the energy temporary storage unit may include one or more than one inductors. In yet another example, the energy temporary storage unit may include at least one capacitor C(X) and/or at least one inductor.

In practice, the balancing circuit 116-X within the specific battery module 110-X can be implemented by utilizing the PCB 112-X of the specific battery module 110-X, and more particularly, may comprise a portion of the PCB 112-X and some of the components mounted on the PCB 112-X. According to this embodiment, the internal terminals T1(X) and T2(X) shown in FIG. 6 are coupled to (more particularly, electrically connected to) the first internal terminal $T1_X$ and the second internal terminal $T2_X$ of the PCB 112-X, respectively, where the first internal terminal $T1_X$ and the second internal terminal $T2_X$ are electrically connected to the two terminals of the battery cell $BA_X$ of the specific battery module 110-X. In addition, the internal terminals T4(X) and T3(X) shown in FIG. 6 are coupled to (more particularly, electrically connected to) the positive terminal and the negative terminal of the whole of the battery cells {$BA_N$, $BA_{N-1}$, $BA_{N-2}$, ..., $BA_1$} (e.g. the system battery terminals PAK+ and PAK− in this embodiment), respectively. Additionally, the aforementioned switch of the balancing circuit 116-X, such as the MOSFET Q(X) shown in FIG. 6, can be utilized for enabling or disabling the balancing circuit 116-X. For example, the gate of the MOSFET Q(X) can be coupled to the control terminal $BB_{ON}$ of the balancing control circuit 114-X shown in FIG. 5. As a result, the balancing circuit 116-X may selectively perform the block balancing of the specific battery module 110-X under control of the balancing control circuit 114-X. For brevity, similar descriptions are not repeated in detail for this embodiment.

The aforementioned is one way to explain the present invention and the following is another way to explain the present invention. Refer to FIG. 1, the present embodiment of the battery system 100 includes several battery modules {110-N, 110-(N−1), 110-(N−2), ..., 110-1} which are connected in series. The configuration of each battery modules {110-N, 110-(N−1), 110-(N−2), ..., 110-1} is substantially the same. The battery system 100 can be implemented by connection several battery modules {110-N, 110-(N−1), 110-(N−2), ..., 110-1} in series. Furthermore, the user can connect the battery system 100 in parallel to form a larger battery system. Hence, the present embodiment is only one way to implement the battery system.

First, one of the battery modules of the battery system will be described herein. The battery module has a first input node, a second input node, a first output node and a second output node. The battery module is configured to connect another battery module. Another battery module also has a first input node, a second input node, a first output node and a second output node. The first input node of another battery module is connected to the first output node of the battery module. The second input node of another battery module is connected to the second output node of the battery module. The battery module includes a battery cell, a reference resistor and a balancing control circuit. The battery cell is connected between the first input node and the first output node of the battery module. The battery cell has a battery voltage. The reference resistor is connected between the second input node and the second output node of the battery module. The reference resistor has a reference voltage. The balancing control circuit is electrically connected to the battery cell and the reference resistor. The balancing control circuit compares the battery voltage and the reference voltage for performing balancing control to the battery cell.

The following uses two battery modules for further explanation. The battery system 100 includes a first battery module 110-N and a second battery module 110-(N−1). The first battery module 110-N is connected to the second battery module 110-(N−1) in series. The first battery module 110-N has a first battery cell $BA_N$, a first reference resistor $R_N$ and a first balancing control circuit (unnumbered). The first battery cell $BA_N$ has a first battery voltage $V_N$. The first reference resistor $R_N$ is arranged corresponding to the first battery cell $BA_N$. The first reference resistor $R_N$ of the first battery module 110-N has a first reference voltage $V_{AVG}$. The first balancing control circuit is electrically connected to the first battery cell $BA_N$ and the first reference resistor $R_N$. The first balancing control circuit compares the first battery voltage $V_N$ and the first reference voltage $V_{AVG}$ for performing balancing control to the first battery cell $BA_N$. On the other hand, the second battery module 110-(N−1) includes a second battery cell $BA_{N-1}$, a second reference resistor $R_{N-1}$ and a second balancing control circuit (unnumbered). The second battery cell $BA_{N-1}$ is connected to the first battery cell $BA_N$ in series. The second battery cell $BA_{N-1}$ has a second battery voltage $V_{N-1}$. The second reference resistor $R_{N-1}$ is arranged corresponding to the second battery cell $BA_{N-1}$. The second reference resistor $R_{N-1}$ of the second battery module 110-(N−1) also has a second reference voltage $V_{AVG}$. The second balancing control circuit is electrically connected to the second battery cell $BA_{N-1}$ and the second reference resistor $R_{N-1}$. The second balancing control circuit compares the second battery voltage $V_{N-1}$ and the second reference voltage $V_{AVG}$ for performing balancing control to the second battery cell $BA_{N-1}$.

The balancing control method with aid of reference voltage information of the battery system 100 includes the following steps: Provide a first battery module 110-N and a second battery module 110-(N−1). Connect the first battery module 110-N and the second battery module 110-(N−1) in series. Provide a first battery cell $BA_N$, a first reference resistor $R_N$ and a first balancing control circuit (unnumbered) within the first battery module 110-N. Provide a second battery cell $BA_{N-1}$, a second reference resistor $R_{N-1}$ and a second balancing control circuit (unnumbered) within the second battery module 110-(N−1). Connect the first battery cell $BA_N$ and the second battery cell $BA_{N-1}$ in series. Arrange the first reference resistor $R_N$ and the second reference resistor $R_{N-1}$ corresponding to the first battery cell $BA_N$ and the second battery cell $BA_{N-1}$ respectively and connect the first reference resistor $R_N$ and the second reference resistor $R_{N-1}$ in series. Detect a first reference voltage $V_{AVG}$ of the first reference resistor $R_N$ by the first balancing control circuit. Detect a second reference voltage $V_{AVG}$ of the second reference resistor $R_{N-1}$ by the second balancing control circuit. Detect a first battery voltage $V_N$ of the first battery cell $BA_N$ by the first balancing control circuit. Detect a second battery voltage $V_{N-1}$ of the second battery cell $BA_{N-1}$ by the second balancing control circuit. The first balancing control circuit performs balancing control to the first battery cell $BA_N$ by comparing the first battery voltage $V_N$ and the first reference voltage $V_{AVG}$. The second balancing control circuit performs balancing control to the second battery cell $BA_{N-1}$ by comparing the second battery voltage $V_{N-1}$ and the second reference voltage $V_{AVG}$. Furthermore, the first battery cell $BA_N$ is controlled to discharge by the first balancing control circuit when the first battery voltage $V_N$ is larger than the first reference voltage $V_{AVG}$. Similarly, the second battery cell $BA_{N-1}$ is controlled to discharge by the second balancing control circuit when the second battery voltage $V_{N-1}$ is larger than the second reference voltage $V_{AVG}$.

There is another way to explain the battery system 100 of the present embodiment. The battery system includes a battery cells string {$BA_N$, $BA_{N-1}$, $BA_{N-2}$, ..., $BA_1$}, a reference resistors string {$R_N$, $R_{N-1}$, $R_{N-2}$, ..., $R_1$} and a balancing control circuits set ({114-X} in FIG. 4.) The battery cells string {$BA_N$, $BA_{N-1}$, $BA_{N-2}$, ..., $BA_1$} has a first battery cell $BA_N$ and a second battery cell $BA_{N-1}$. The first battery cell $BA_N$ and the second battery cell $BA_{N-1}$ are connected in series. The first battery cell $BA_N$ has a first battery voltage $V_N$ and the second battery cell $BA_{N-1}$ has a second battery voltage $V_{N-1}$. The reference resistors string {$R_N$, $R_{N-1}$, $R_{N-2}$, ..., $R_1$} is connected to the battery cells string {$BA_N$, $BA_{N-1}$, $BA_{N-2}$, ..., $BA_1$} in parallel. The reference resistors string {$R_N$, $R_{N-1}$, $R_{N-2}$, ..., $R_1$} has a first reference resistor $R_N$ and a second reference resistor $R_{N-1}$. The first reference resistor $R_N$ and the second reference resistor $R_{N-1}$ are connected in series. The first reference resistor $R_N$ has a first reference voltage $V_{AVG}$ and the second reference resistor $R_{N-1}$ has a second reference voltage $V_{AVG}$. The balancing control circuits set ({114-X} in FIG. 4.) has a first balancing control circuit (unnumbered) and a second balancing control circuit (unnumbered.) The first balancing control circuit is electrically connected to the first battery cell $BA_N$ and the first reference resistor $R_N$. The second balancing control circuit is electrically connected to the second battery cell $BA_{N-1}$ and the second reference resistor $R_{N-1}$. The first balancing control circuit performs balancing control to the first battery cell $BA_N$ by comparing the first battery voltage $V_N$ and the first reference voltage $V_{AVG}$. The second balancing control circuit performs balancing control to the second battery cell $BA_{N-1}$ by comparing the second battery voltage $V_{N-1}$ and the second reference voltage $V_{AVG}$.

It is worthy to note that the resistance of each reference resistor of the reference resistors string $\{R_N, R_{N-1}, R_{N-2}, \ldots, R_1\}$ are the same so that the value of each reference voltage $V_{AVG}$ of each reference resistor are also the same. The reference voltage is an ideal battery voltage for each battery cell. For instance, the first battery voltage $V_N$ is 10V and the second battery voltage $V_{N-1}$ is 14V. The first reference resistor $R_N$ which is arranged corresponding to the first battery cell $BA_N$ and the second reference resistor $R_{N-1}$ which is arranged corresponding to the second battery cell $BA_{N-1}$ are connected in series, then connected to the first battery cell $BA_N$ and the second battery cell $BA_{N-1}$ in parallel. The first reference resistor $R_N$ and the second reference resistor $R_{N-1}$ will equally divide a package voltage (24V) which includes the first battery voltage $V_N$ and the second battery voltage $V_{N-1}$ due to the resistance of the first reference resistor $R_N$ and the second reference resistor $R_{N-1}$ are the same. Accordingly, the first reference voltage $V_{AVG}$ of the first reference resistor $R_N$ is 12V and the second reference voltage $V_{AVG}$ of the second reference resistor $R_{N-1}$ is also 12V, which means the ideal battery voltage for each battery cell is 12V. After comparing the first battery voltage $V_N$ to the first reference voltage $V_{AVG}$, the first balancing control circuit will not activate the balancing mechanism because the first battery voltage $V_N$ (10V) is smaller than the first reference voltage $V_{AVG}$ (12V.) On the other hand, the second balancing control circuit will control to discharge the second battery cell $BA_{N-1}$ after comparing the second battery voltage $V_{N-1}$ to the second reference voltage $V_{AVG}$ because the second battery voltage $V_{N-1}$ (14V) is larger than the second reference voltage $V_{AVG}$ (12V.)

Refer to FIG. 1, FIG. 3 and FIG. 4. FIG. 3 is detailed schematic of FIG. 1. FIG. 4 is a partial schematic of a balancing control circuit of each battery module {110-N, 110-(N−1), 110-(N−2), . . . , 110-1}. In other words, each battery module {110-N, 110-(N−1), 110-(N−2), . . . , 110-1} has the balancing control circuit 114-X as shown in FIG. 4. In fact, the balancing control circuit 114-X is merely a part of the complete balancing control circuit. The function of the balancing control circuit 114-X only includes retrieving the reference voltage $V_{AVG}$ then comparing the reference voltage $V_{AVG}$ to the battery voltage $\{V_N, V_{N-1}, V_{N-2}, \ldots, v_1\}$. It should be noted that FIG. 4 is one way for implementing the balancing control circuit 114-X within the battery module {110-N, 110-(N−1), 110-(N−2), . . . , 110-1}. Other embodiments can achieve the same function with the present embodiment will not depart from the spirit of the present invention.

The actual operation of the present embodiment will encounter the following two challenges: (1) how to obtain the precise reference voltage $V_{AVG}$ and (2) the design of the balancing control circuit 114-X. First, the number of the reference resistors of the reference resistors string $\{R_N, R_{N-1}, R_{N-2}, \ldots, R_1\}$ is the same with the number of the battery cells of the battery cells string $\{BA_N, BA_{N-1}, BA_{N-2}, \ldots, BA_1\}$ so that the reference voltage $V_{AVG}$ of each reference resistor is the ideal battery voltage for each battery cell. To further improve the accuracy, the reference resistor of the present embodiment is the high-precision resistor. Specifically, the tolerance of the reference resistor is less than 0.1%. Even if the user connects more than 30 modules {110-N, 110-(N−1), 110-(N−2), . . . , 110-1}, the tolerance of the reference voltage is less than 2%. It should be noted that the present embodiment not only uses the reference resistor with little error, but also uses the reference resistor with large resistance for avoiding affecting the current flowing through the battery cell. Specifically, the resistance of the reference resistor in the present embodiment is larger than one kilo-ohm.

Second, the characteristic and the life differ from each battery cell, so the battery voltage of every battery cell may be unbalance during the charge-discharge process. At the same time, in order to conduct the balancing control respectively, every battery module has its own balancing control circuit 114-X. For example, the first battery module 110-N has no need to communicate with the second battery module 110-(N−1) and can perform the balancing control itself. The balancing control circuit is not limited to a passive or an active balancing control circuit.

During the charging process, the balancing control circuit 114-X will detect the reference voltage $V_{AVG}$ of the corresponded reference resistor. In particular, refer to FIG. 4, a terminal VFAx is connected to a terminal GNDx and a terminal VFBx is connected to a terminal VREFx. The voltage signals of two ends of the reference resistor R are inputted into an operational amplifier OPa via the terminal VFBx and an operational amplifier OPb via the terminal VFAx respectively. After being buffered by the operational amplifier OPa and the operational amplifier OPb, the voltage signals of two ends of the reference resistor R are further inputted into an operational amplifier OPc. The voltage signals of two ends of the reference resistor R will be amplified by the operational amplifier OPc with a specific time(s) and then being outputted to a positive electrode of a comparator CPx. On the other hand, the voltage signals of two ends of the battery cell will pass through similar circuit and be outputted to a negative electrode of the comparator CPx. As a result, the comparator CPx compares the reference voltage $V_{AVG}$ and the battery voltage Vx then generates a control signal from a control terminal $BB_{ON}$. Take the first battery module 110-N for example, the battery cell will be controlled to discharge by the balancing control circuit 114-X when the battery voltage $V_N$ is larger than the reference voltage $V_{AVG}$. It is worthy to note that the aforementioned "discharge" includes the situation of consuming the extra energy of the battery cell by the passive way and the situation that feedback the extra energy of the battery cell to the entire battery system 100 by the positive way.

Similar to the reference resistor $\{R_N, R_{N-1}, R_{N-2}, \ldots, R_1\}$, the impedances of the operational amplifier OPa, OPb and the comparator CPx are all very large to avoid affecting the current flowing through the reference resistor $\{R_N, R_{N-1}, R_{N-2}, \ldots, R_1\}$ and to avoid affecting the accuracy of the reference voltage $V_{AVG}$ as well. Specifically, the impedances of the operational amplifier OPa, OPb in the present embodiment are both around five to ten mega-ohm and the impedance of the comparator CPx is even larger than one giga-ohm.

Refer to FIG. 5. FIG. 5 is another balancing control circuit of the battery system of FIG. 1. The main difference between FIG. 4 and FIG. 5 is that each reference resistor $\{R_N, R_{N-1}, R_{N-2}, \ldots, R_1\}$ as shown is FIG. 5 is divided into three parts equally. The terminal VFAx is connected to a node NA and the terminal VFBx is connected to a node NB, which means that the balancing control circuit retrieving the voltage signals from two ends of the reference resistor R/3. It is different from the balancing control circuit as shown is FIG. 4 retrieving the voltage signals from the two ends of the reference resistor R.

Return to FIG. 5, the voltage signals of the two ends of the reference resistor R/3 are inputted into an operational amplifier OPa via the terminal VFBx and an operational amplifier OPb via the terminal VFAx respectively and further inputted into an operational amplifier OPc. In FIG. 5, the voltage signals of two ends of the reference resistor R/3 will be amplified by the operational amplifier OPc with three times and then being outputted to a positive electrode of a comparator CPx. The rest of the operation of FIG. 5 is substantially the same with FIG. 4, thus similar description are not repeated in detail herein. The design of dividing each reference resistor R into three parts is in response to the characteristics of the operational amplifier OPa, OPb, OPc and the comparator CPx for avoiding the damages to the operational amplifier OPa, OPb, OPc and the comparator CPx. Except the foregoing design, there is another way to achieve the same goal. For instance, the design can be dividing each reference resistor R into (2/5)R, (1/5)R and (2/5)R, and then retrieving the voltage signals from two ends of the (1/5)R for subsequent processing.

There are many advantages for applying the present invention of the battery system and balancing control method with aid of reference voltage information thereof. By modularizing the battery system, the battery module not only can conduct the balancing control without signally communicating with other battery module, but also enhances the using flexibility dramatically. Every battery module has its own independent balancing control circuit, plus the design of the reference resistor, can perform balancing control independently. For the different needs to increase or decrease the power supply of the battery system, the user has no need to amend the design of the balancing control circuit or the hardware facilities, but merely installs or removes a predetermined number of the battery module(s) to meet the new need. Besides, the battery module is convenient and flexible to manufacture, test, installation or maintenance (e.g. replace the failed battery module).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A battery system balancing control method for performing balancing control with aid of reference voltage information, the battery system balancing control method being applied to a power supply device, the battery system balancing control method comprising the steps of:
    after a first reference resistor of a plurality of reference resistors is installed into a first battery module of a set of battery modules connected in series within the power supply device and a second reference resistor of the plurality of reference resistors is installed into a second battery module of the set of battery modules and the reference resistors are electrically connected in series, converting a total voltage of the set of battery modules into the reference voltage information, wherein the first battery module comprises a first battery cell having a first battery voltage, the second battery module comprises a second battery cell having a second battery voltage, and the reference voltage information comprises a first set of reference voltage levels corresponding to the first reference resistor and a second set of reference voltage levels corresponding to the second reference resistor; and
    performing balancing control of the first battery module according to the first set of reference voltage levels corresponding to the first reference resistor, and performing balancing control of the second battery module according to the second set of reference voltage levels corresponding to the second reference resistor.

2. The battery system balancing control method of claim 1, wherein a resistance error value of the first reference resistor is less than 0.1%.

3. The battery system balancing control method of claim 1, wherein the step of performing balancing control of the first battery module according to the first set of reference voltage levels corresponding to the first reference resistor further comprises:
    when the first battery voltage is greater than a first reference voltage corresponding to a voltage difference between the first set of reference voltage levels, controlling the first battery cell to discharge.

4. The battery system balancing control method of claim 1, wherein the first reference resistor is divided into a first resistor, a second resistor, and a third resistor; and each of a resistance value of the first resistor and a resistance value of the third resistor is equivalent to two-fifth of a resistance value of the first reference resistor, and a resistance value of the second resistor is equivalent to one-fifth of the resistance value of the first reference resistor.

5. The battery system balancing control method of claim 4, wherein based on a first reference voltage corresponding to a voltage difference between the first set of reference voltage levels, the first battery cell is selectively controlled to discharge; and the first reference voltage is a voltage difference between two terminals of the second resistor.

6. The battery system balancing control method of claim 1, wherein based on a first reference voltage corresponding to a voltage difference between the first set of reference voltage levels, a first balancing control circuit is arranged to selectively control the first battery cell to discharge, wherein the first balancing control circuit comprises a first comparator; and the first comparator comprises a positive terminal and a negative terminal, wherein the first reference voltage is input into the positive terminal, and the first battery voltage is input into the negative terminal.

7. The battery system balancing control method of claim 6, wherein an input impedance of the first comparator is greater than 1 giga-ohm.

8. The battery system balancing control method of claim 1, wherein a resistance value of the first reference resistor is greater than 1000 ohms.

9. The battery system balancing control method of claim 1, wherein based on a first reference voltage corresponding to a voltage difference between the first set of reference voltage levels, a first balancing control circuit is arranged to selectively control the first battery cell to discharge; and the first balancing control circuit is a passive balancing control circuit.

10. The battery system balancing control method of claim 1, wherein based on a first reference voltage corresponding to a voltage difference between the first set of reference voltage levels, a first balancing control circuit is arranged to selectively control the first battery cell to discharge; and the first balancing control circuit is an active balancing control circuit.

11. A battery system for performing balancing control with aid of reference voltage information, the battery system comprising at least one portion of a power supply device, the battery system comprising:
    a first battery module, which is one of a set of battery modules connected in series within the power supply device, wherein the first battery module comprises:
        a first battery cell having a first battery voltage;

a first reference resistor, which is one of a plurality of reference resistors electrically connected in series to convert a total voltage of the set of battery modules into the reference voltage information, wherein the first reference resistor of the plurality of reference resistors is installed into the first battery module to generate a first set of reference voltage levels, and the reference voltage information comprises the first set of reference voltage levels; and a first balancing control circuit, electrically connected to the first battery cell and the first reference resistor, arranged to perform balancing control of the first battery module according to the first set of reference voltage levels corresponding to the first reference resistor; and a second battery module, which is another one of the set of battery modules connected in series within the power supply device, wherein the second battery module comprises:

a second battery cell connected to the first battery cell in series and having a second battery voltage;

a second reference resistor connected to the reference resistor in series and being another one of the plurality of reference resistors electrically connected in series to convert the total voltage of the set of battery modules into the reference voltage information, wherein the second reference resistor of the plurality of reference resistors is installed into the second battery module to generate a second set of reference voltage levels, and the reference voltage information comprises the second set of reference voltage levels; and a second balancing control circuit, electrically connected to the second battery cell and the second reference resistor, arranged to perform balancing control of the second battery module according to the second set of reference voltage levels corresponding to the second reference resistor.

12. The battery system of claim 11, wherein a resistance error value of the first reference resistor is less than 0.1%.

13. The battery system of claim 11, wherein when the first battery voltage is greater than a first reference voltage corresponding to a voltage difference between the first set of reference voltage levels, the first balancing control circuit controls the first battery cell to discharge.

14. The battery system of claim 11, wherein the first reference resistor is divided into a first resistor, a second resistor, and a third resistor; and each of a resistance value of the first resistor and a resistance value of the third resistor is equivalent to two-fifth of a resistance value of the first reference resistor, and a resistance value of the second resistor is equivalent to one-fifth of the resistance value of the first reference resistor.

15. The battery system of claim 14, wherein based on a first reference voltage corresponding to a voltage difference between the first set of reference voltage levels, the first balancing control circuit selectively controls the first battery cell to discharge; and the first reference voltage is a voltage difference between two terminals of the second resistor.

16. The battery system of claim 11, wherein based on a first reference voltage corresponding to a voltage difference between the first set of reference voltage levels, the first balancing control circuit selectively controls the first battery cell to discharge, wherein the first balancing control circuit comprises a first comparator; and the first comparator comprises a positive terminal and a negative terminal, wherein the first reference voltage is input into the positive terminal, and the first battery voltage is input into the negative terminal.

17. The battery system of claim 16, wherein an input impedance of the first comparator is greater than 1 giga-ohm.

18. The battery system of claim 11, wherein a resistance value of the first reference resistor is greater than 1000 ohms.

19. The battery system of claim 11, wherein the first balancing control circuit is a passive balancing control circuit.

20. The battery system of claim 11, wherein the first balancing control circuit is an active balancing control circuit.

* * * * *